US007575095B2

(12) United States Patent
An et al.

(10) Patent No.: US 7,575,095 B2
(45) Date of Patent: Aug. 18, 2009

(54) SPEAKER

(75) Inventors: Chang Wuk An, Osan (KR); Jung Woo Choi, Goyang (KR)

(73) Assignee: LG Electronics Inc., Seoul (KR)

(*) Notice: Subject to any disclaimer, the term of this patent is extended or adjusted under 35 U.S.C. 154(b) by 156 days.

(21) Appl. No.: 11/486,092

(22) Filed: Jul. 14, 2006

(65) Prior Publication Data

US 2007/0144826 A1 Jun. 28, 2007

(30) Foreign Application Priority Data

Dec. 28, 2005 (KR) ...................... 10-2005-0131155
Apr. 14, 2006 (KR) ...................... 10-2006-0034220

(51) Int. Cl.
*A47B 81/06* (2006.01)
*H05K 5/00* (2006.01)
*H04R 25/00* (2006.01)
*H04R 1/02* (2006.01)

(52) U.S. Cl. ....................... 181/199; 181/144; 181/153; 181/156; 381/89; 381/182; 381/335; 381/386; 381/387

(58) Field of Classification Search ................. 181/199, 181/153, 144, 156
See application file for complete search history.

(56) References Cited

U.S. PATENT DOCUMENTS 1,866,831 A * 7/1932 Wolff et al. ................. 181/147
1,932,343 A * 10/1933 Holland ...................... 181/144
3,688,864 A * 9/1972 Guss ........................... 381/89
3,815,707 A * 6/1974 Burhoe ....................... 181/199
4,054,750 A * 10/1977 Montgomery et al. ....... 381/335
4,057,689 A * 11/1977 Stallings, Jr. ................ 381/335
4,146,111 A * 3/1979 Mae et al. ................... 181/154
4,169,516 A * 10/1979 Honda ........................ 181/153
4,182,931 A * 1/1980 Kenner ........................ 381/89
4,292,679 A * 9/1981 Kondo et al. ................ 367/188
4,298,087 A * 11/1981 Launay ....................... 181/153
4,332,986 A * 6/1982 Butler ........................ 381/349
4,348,552 A * 9/1982 Siccone ....................... 381/99
4,882,760 A * 11/1989 Yee ............................ 381/335
4,884,655 A * 12/1989 Freadman et al. ........... 181/145

(Continued)

FOREIGN PATENT DOCUMENTS

JP 05-095592 A 4/1993

(Continued)

*Primary Examiner*—Jeffrey Donels
*Assistant Examiner*—Christina Russell
(74) *Attorney, Agent, or Firm*—Birch, Stewart, Kolasch & Birch, LLP

(57) ABSTRACT

A speaker includes a housing; a support assembly installed on the lower end of the housing to support the housing; at least one first speaker unit installed in the housing to reproduce a sound signal; and a second speaker unit installed in the support assembly to reproduce a sound signal which belongs to a low sound band. Openings are defined through both sides of the support assembly to transmit to the outside sound reproduced by the second speaker unit. A guide cone is provided to the lower end of the support assembly to guide sound toward the openings. The speaker unit can be installed in a baffle which is supported at the opened front end of the housing to be rotated about a vertical axis. Through rotating the baffle, the speaker unit can be actually rotated within a predetermined range to change a sound transmission direction.

24 Claims, 8 Drawing Sheets

U.S. PATENT DOCUMENTS

| | | | | | |
|---|---|---|---|---|---|
| 4,953,223 | A | * | 8/1990 | Householder | 381/387 |
| 5,133,428 | A | * | 7/1992 | Perrson | 181/153 |
| 5,309,518 | A | * | 5/1994 | Ickler et al. | 381/336 |
| 5,321,756 | A | * | 6/1994 | Patterson et al. | 381/308 |
| 5,502,772 | A | * | 3/1996 | Felder | 381/386 |
| 5,859,917 | A | * | 1/1999 | Silber et al. | 381/389 |
| 6,002,780 | A | * | 12/1999 | Espiritu | 381/182 |
| 6,058,199 | A | * | 5/2000 | Umitsu | 381/395 |
| 6,101,261 | A | * | 8/2000 | Brown et al. | 381/386 |
| 6,101,262 | A | * | 8/2000 | Haase et al. | 381/386 |
| 6,257,365 | B1 | * | 7/2001 | Hulsebus, II | 181/155 |
| 6,279,678 | B1 | * | 8/2001 | Tracy | 181/144 |
| 6,282,297 | B1 | * | 8/2001 | Lin | 381/386 |
| 6,343,135 | B1 | * | 1/2002 | Ellero et al. | 381/387 |
| 6,910,549 | B2 | * | 6/2005 | Kung | 181/199 |
| 7,077,236 | B2 | * | 7/2006 | Sleboda et al. | 181/150 |
| 7,113,607 | B1 | * | 9/2006 | Mullins | 381/96 |
| 7,218,747 | B2 | * | 5/2007 | Huffman | 381/345 |
| 7,237,648 | B2 | * | 7/2007 | Lee et al. | 181/199 |
| 2002/0150272 | A1 | * | 10/2002 | Nakamura | 381/387 |
| 2004/0156517 | A1 | * | 8/2004 | Schmidt et al. | 381/334 |
| 2005/0058314 | A1 | * | 3/2005 | Lee et al. | 381/335 |
| 2005/0123156 | A1 | * | 6/2005 | Wright et al. | 381/182 |
| 2006/0023910 | A1 | * | 2/2006 | Tsutsumi | 381/351 |
| 2006/0165250 | A1 | * | 7/2006 | Edwin | 381/386 |
| 2006/0219474 | A1 | * | 10/2006 | Goh et al. | 181/156 |
| 2006/0280326 | A1 | * | 12/2006 | Stevens et al. | 381/386 |

FOREIGN PATENT DOCUMENTS

| | | | |
|---|---|---|---|
| KR | 1999-0018913 | U | 6/1999 |
| KR | 1999-0023989 | U | 7/1999 |
| KR | 10-0387963 | A | 6/2003 |

* cited by examiner

-- Related Art --

SPEAKER

BACKGROUND OF THE INVENTION

1. Field of the Invention

The present invention relates to a speaker, and more particularly to a speaker which has a wide reproducible sound band and is constructed to allow an angle of a speaker unit to be adjusted.

2. Description of the Prior Art

These days, as audio and video devices have been rapidly distributed throughout the world, the importance of a speaker is highlighted in addition to the importance of a display, and the demand for speakers gradually increases. Specifically, speakers having the advantages of small-sized bookshelf type speakers and capable of being installed in a narrow space without using separate speaker brackets are gaining popularity.

FIG. 1 is a perspective view illustrating the construction of a conventional speaker. Referring to FIG. 1, the speaker 1 has a housing 3 which is formed in the shape of a box to be narrow and elongate in the vertical direction. The housing 3 defines the outer appearance of the speaker 1. The housing 3 may have various cross-sectional shapes such as circular, quadrangular, and so forth.

A support 5 is provided to the lower end of the housing 3 so that the speaker 1 can stably stand on a base. The support 5 is secured to the lower end of the housing 3 and has a disc-shaped configuration possessing a predetermined area.

A speaker unit 7 is installed on one surface of the housing 3 such that the front surface of the speaker unit 7 is exposed to the outside. The speaker unit 7 functions to receive an electric signal from an audio device (not shown) and convert the electric signal into an audible sound signal. The speaker unit 7 is generally installed in a manner such that it is partially exposed on one surface of the housing 3 or is covered by a grille.

The conventional speaker 1 constructed as mentioned above has problems described below.

In the conventional speaker 1, the speaker unit 7 is installed over a partial region of the housing 3 which extends from the upper end to the middle portion of the housing 3. Therefore, the speaker unit 7 can only reproduce a sound signal which is within its own reproducible sound band. Consequently, the speaker 1 is insufficient to reproduce an original sound as it is because the speaker 1 can only reproduce a sound signal which belongs to a specific sound band, whereby an affluent sound volume cannot be provided.

Further, in the conventional speaker 1, the speaker unit 7 is installed to be secured to the front surface of the housing 3. That is to say, because the direction of the speaker unit 7 is fixed, limitations necessarily exist in transmitting sound in a proper direction. Consequently, a drawback is caused in that the entire speaker 1 must be moved in order to change a sound transmission direction.

SUMMARY OF THE INVENTION

Accordingly, the present invention has been made to solve the above-mentioned problems occurring in the prior art, and an object of the present invention is to enable the reproduction of sound signals belonging to various sound bands through the use of one speaker.

Another object of the present invention is to improve space utilization efficiency when installing speaker units in a speaker.

Another object of the present invention is to reliably transmit to the outside a sound signal outputted from a speaker unit provided to the lower part of a speaker.

Still another object of the present invention is to provide a speaker which can reproduce sound signals belonging to various sound bands while being miniaturized in its size.

Yet still another object of the present invention is to enable the angle of a speaker unit to be freely adjusted so as to allow convenient change of a sound transmission direction.

In order to achieve the above objects, according to one aspect of the present invention, there is provided a speaker including a housing; a support assembly installed on a lower end of the housing to support the housing; at least one first speaker unit installed in the housing to reproduce a sound signal; and a second speaker unit installed in the support assembly to reproduce a sound signal which belongs to a relatively low sound band.

In the speaker according to the present invention, as the speaker unit is installed in the support assembly, a sufficient number of speaker units can be provided, and therefore, it is possible to render high quality sound. As a consequence, the present speaker can render sufficient sound quality while having the same size.

According to another aspect of the present invention, the first speaker unit is installed to face the front through a front end of the housing, and the second speaker unit is installed to face the floor on which the support assembly is placed.

According to another aspect of the present invention, the first speaker unit is installed in a baffle which is rotatably supported at the front end of the housing which is opened. Therefore, since the direction of the speaker unit can be adjusted through rotating the baffle, a sound transmission direction can be changed as desired by a user.

According to another aspect of the present invention, the support assembly includes a support frame coupled to the housing, and having a ring-shaped ring part and supporting parts which extend from opposite ends of the ring part to be connected with each other at distal ends thereof; a unit case installed between the supporting parts of the support frame, having installed therein the second speaker unit, and defined with openings for communicating the exterior and interior of the support assembly with each other; cover members attached to the supporting parts to constitute an outer appearance of the support assembly; and a guide cone installed on lower ends of the supporting parts to face the second speaker unit to guide sound outputted from the second speaker unit.

According to another aspect of the present invention, a base plate is secured to the ring part of the support frame to constitute a lower surface of the support assembly.

According to another aspect of the present invention, the guide cone is integrally formed with the base plate and has a frusto-conical configuration.

According to another aspect of the present invention, the first speaker unit has a planar configuration and reproduces a sound signal which belongs to a medium sound band.

According to another aspect of the present invention, a plurality of first speaker units are installed on a middle portion of the housing to be arranged in a vertical direction.

According to another aspect of the present invention, the speaker further includes a third speaker unit installed on an upper end of the housing to reproduce a sound signal which belongs to a high sound band.

According to another aspect of the present invention, the housing has a hexahedral configuration in which a leftward and rightward width is greater than a forward and rearward width and which is flat and elongate in the vertical direction.

According to another aspect of the present invention, the baffle can be rotated about a vertical axis and covers the entire front end of the housing which is opened.

According to another aspect of the present invention, the baffle can be rotated about a horizontal axis and covers the entire front end of the housing which is opened. According to another aspect of the present invention, a front panel is installed on a front surface of the baffle and has a grille cap at a position which faces the first speaker unit.

According to another aspect of the present invention, the baffle has a semi-circular column-shaped configuration which has a flat front surface. According to another aspect of the present invention, each of both sides of the baffle is formed in the shape of an arc which has a radius of curvature corresponding to a half of the leftward and rightward width of the housing. Here, it is preferred that a rear end of the baffle be opened to communicate the inside of the baffle with the inside of the housing.

According to another aspect of the present invention, rotation pins are formed at widthwise middles of front ends on upper and lower end surfaces of the baffle, and pin holes are defined on upper and lower inner surfaces of the housing at positions corresponding to the rotation pins so that the rotation pins can be rotatably supported in the pin holes, respectively.

According to another aspect of the present invention, the housing is divided into a plurality of compartments by at least one partitioning wall, and a plurality of baffles are installed in the plurality of compartments. At least one speaker unit is installed in each baffle.

According to another aspect of the present invention, there is provided a speaker including a housing; a support assembly installed on a lower end of the housing to support the housing; at least one first speaker unit installed in the housing to reproduce a sound signal; and a second speaker unit installed in the support assembly to reproduce a sound signal which belongs to a relatively low sound band, wherein openings are defined through both sides of the support assembly to transmit to the outside sound reproduced by the second speaker unit, and a guide cone is provided to a lower end of the support assembly to guide sound toward the openings.

According to another aspect of the present invention, the support assembly includes a support frame formed through die-casting, coupled to the housing, and having a ring-shaped ring part and supporting parts which extend from opposite ends of the ring part to be connected with each other at distal ends thereof; a unit case installed between the supporting parts of the support frame, having installed therein the second speaker unit, and defined with the openings for communicating the exterior and interior of the support assembly with each other; cover members attached to the supporting parts to constitute an outer appearance of the support assembly; and a base plate constituting a lower surface of the support assembly and having the guide cone for guiding sound outputted from the second speaker unit.

According to still another aspect of the present invention, each first speaker unit has a planar configuration and reproduces a sound signal which belongs to a medium sound band, and a plurality of first speaker units are installed on a middle portion of the housing to be arranged in a vertical direction. According to another aspect of the present invention, the speaker further includes a third speaker unit installed on an upper end of the housing to reproduce a sound signal which belongs to a high sound band.

According to yet still another aspect of the present invention, there is provided a speaker including a housing opened at a front end thereof; a support assembly installed on a lower end of the housing to support the housing; a baffle covering the entire front end of the housing which is opened, and installed to be rotated about a vertical axis; at least one speaker unit installed in the baffle; and at least one speaker unit installed in the support assembly.

In the speaker according to the present invention having the construction as described above, since sound signals belonging to various sound bands can be reproduced, it is possible to provide a speaker capable of rendering an affluent sound volume. Also, as the inside space of the speaker can be efficiently utilized to install various speaker units, the speaker can be advantageously miniaturized. Moreover, when a planar speaker unit is used, it is possible to reproduce sound signals belonging to wide sound bands without increasing the size of the speaker, and a clear sound without noise can be provided to a user. Further, in the present invention, because the angle of the speaker unit installed in the housing can be easily adjusted, a sound transmission direction can be conveniently changed, and limitations regarding installation position of the speaker can be eliminated.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
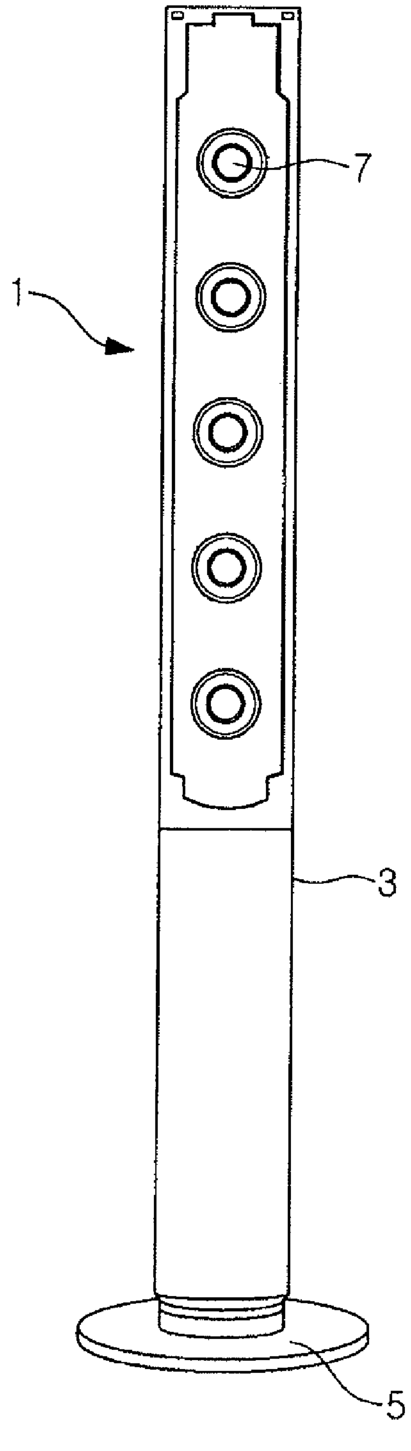
FIG. 1 is a perspective view illustrating the construction of a conventional speaker.

Hereinafter, preferred embodiments of the present invention will be described with reference to the accompanying drawings. In the following description and drawings, the same reference numerals are used to designate the same or similar components.

Figure 2:
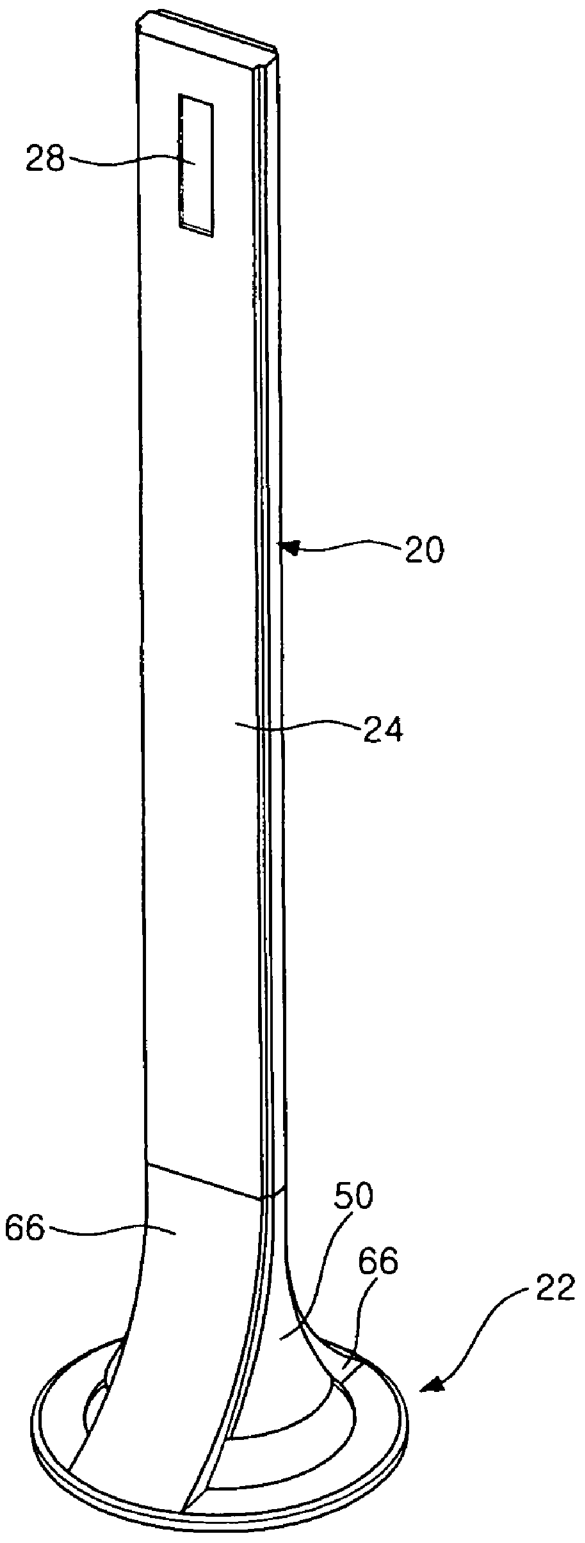
FIG. 2 is a perspective view illustrating the outer appearance of a speaker in accordance with a first embodiment of the present invention.
Figure 3:
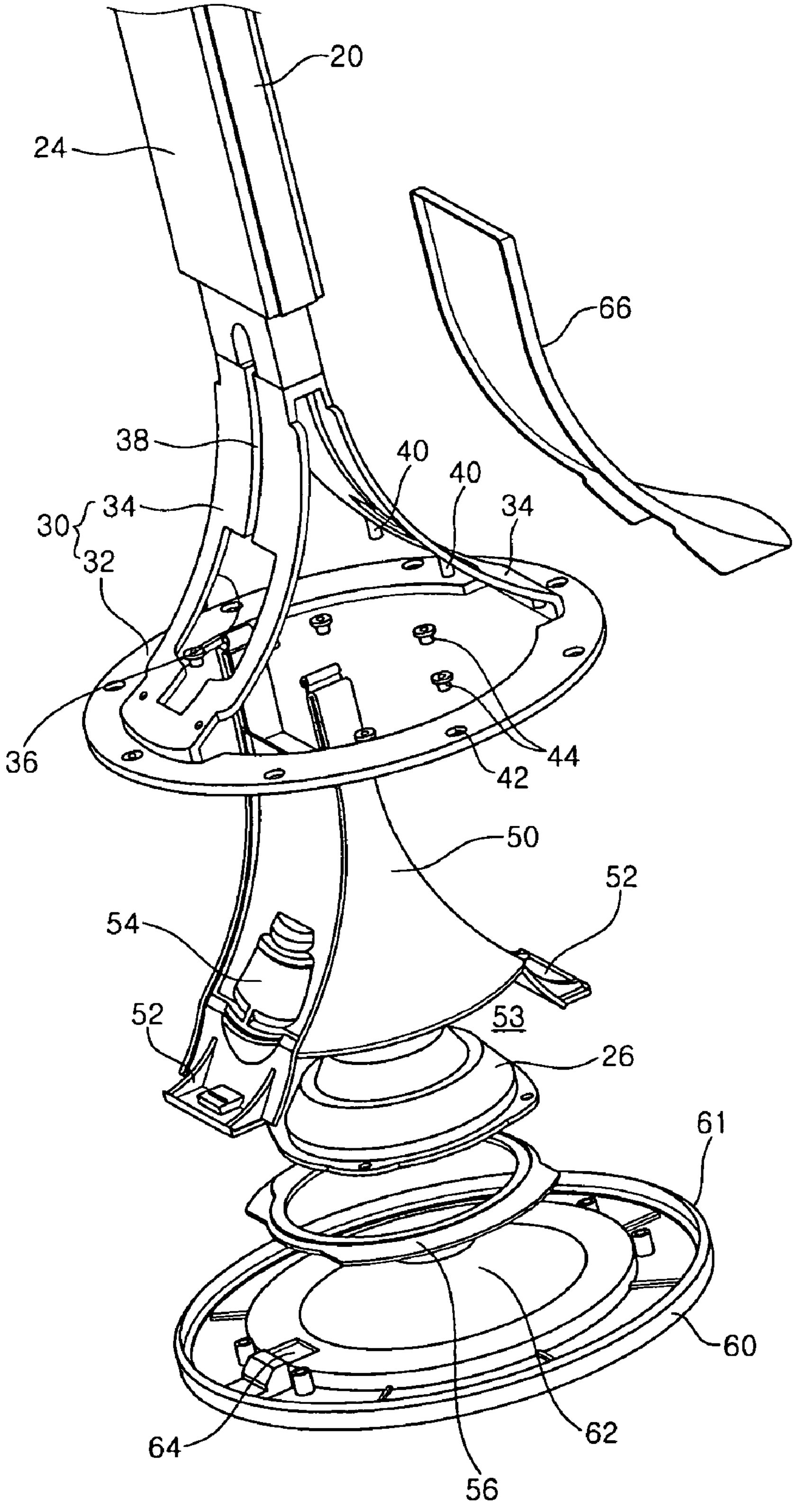
FIG. 3 is an exploded perspective view illustrating the construction of the speaker according to the first embodiment of the present invention.
Figure 4:
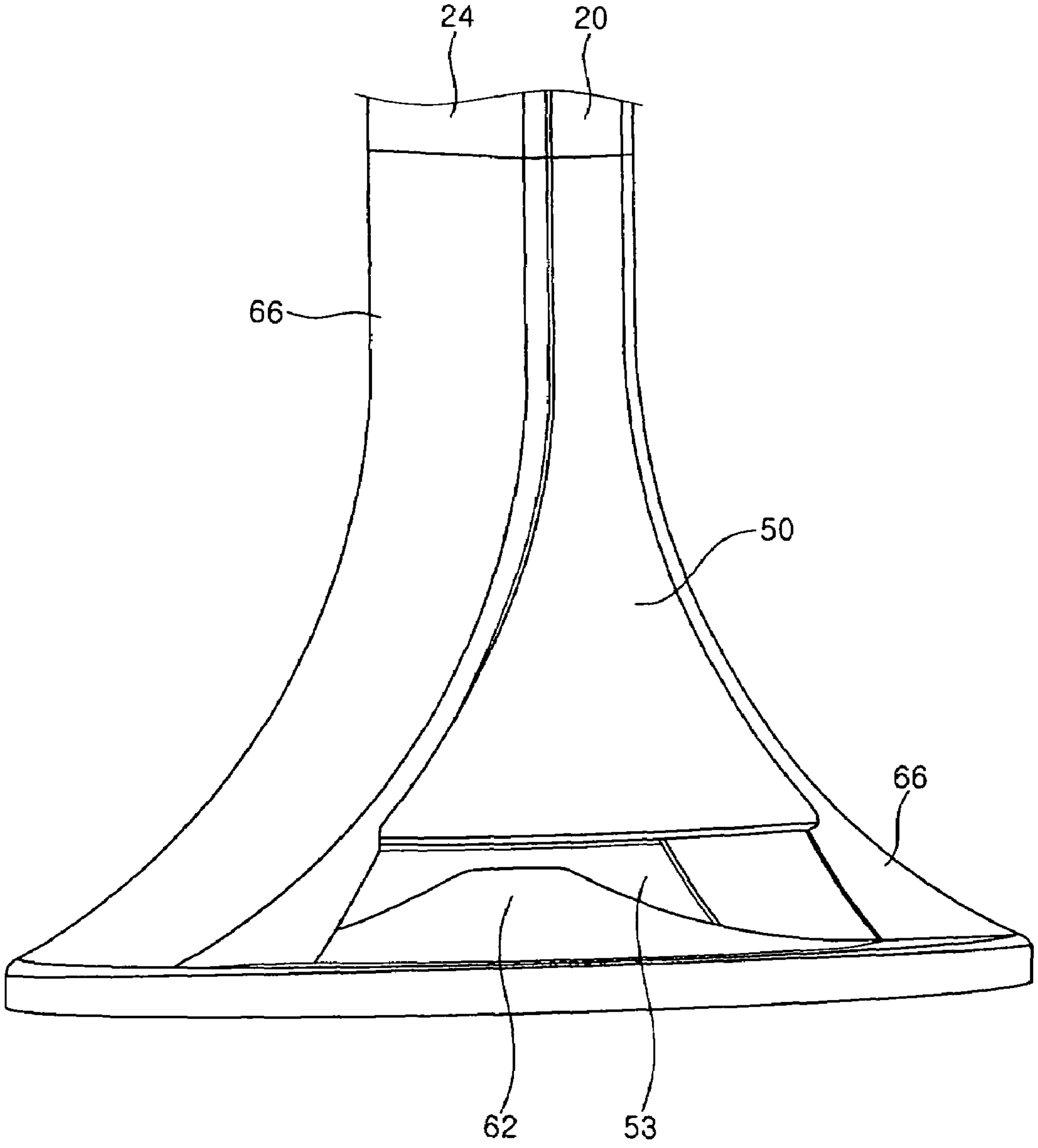
FIG. 4 is a perspective view illustrating the construction of a support assembly constituting the speaker according to the first embodiment of the present invention.
Figure 5:
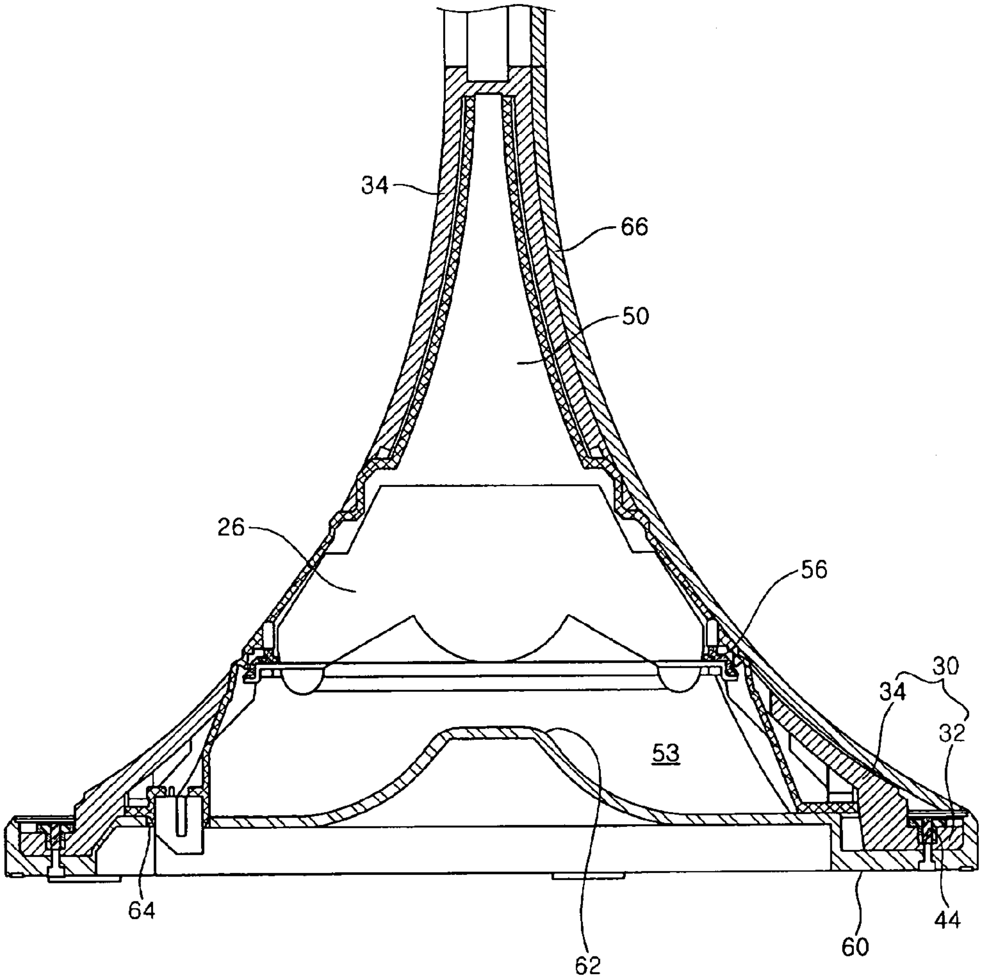
FIG. 5 is a schematic cross-sectional view illustrating the construction of the support assembly constituting the speaker according to the first embodiment of the present invention.

FIG. 2 is a perspective view illustrating the outer appearance of a speaker in accordance with a first embodiment of the present invention, FIG. 3 is an exploded perspective view illustrating the construction of the speaker according to the first embodiment of the present invention, FIG. 4 is a perspective view illustrating the construction of a support assembly constituting the speaker according to the first embodiment of the present invention, and FIG. 5 is a schematic cross-sectional view illustrating the construction of the support assembly constituting the speaker according to the first embodiment of the present invention.

Referring to the drawings, the speaker according to this first embodiment of the present invention includes a housing 20 and a support assembly 22 which constitute the outer appearance of the speaker. In this regard, it is sufficient that the housing 20 has a configuration on which at least one speaker unit can be installed. In the illustrated embodiment, the housing 20 has a hexahedral configuration in which a forward and rearward width is relatively less than a leftward and rightward width and which is flat and elongate in the vertical direction. Further, it is sufficient that the support assembly 22 has a configuration which can support the housing 20 with respect to a floor. In the illustrated embodiment, the support assembly 22 is formed to have a substantially conical configuration.

A plurality of speaker units are installed on the front surface of the housing 20. Preferably, the plurality of speaker units are installed such that they can reproduce sound signals which belong to different sound bands. In the illustrated embodiment, first and third speaker units 24 and 28 are installed on the front surface of the housing 20. The first speaker unit 24 is installed to extend from the upper end to the lower end of the housing 20 on the front surface of the housing 20. The first speaker unit 24 mainly functions to reproduce a sound signal which belongs to a medium sound band. The first speaker unit 24 includes a so-called planar speaker which has a flat outer appearance. A plurality of first speaker units 24 can be installed in the housing 20.

The third speaker unit 28 is installed on the upper end of the housing 20. The third speaker unit 28 mainly functions to reproduce a sound signal which belongs to a high sound band. To this end, the third speaker unit 28 includes a so-called tweeter.

In the case that the housing 20 is formed to have the flat hexahedral configuration as in the illustrated embodiment, preferably, the first and third speaker units 24 and 28 have substantially flat outer appearances such that they can be appropriately received in the housing 20. This is to conform to the construction of the housing 20 and to minimize the size of the entire speaker.

Meanwhile, a second speaker unit 26 is installed in the support assembly 22. The second speaker unit 26 mainly functions to reproduce a sound signal which belongs to a low sound band. To this end, the second speaker unit 26 includes a so-called woofer. In the illustrated embodiment, the second speaker unit 26 is installed in the support assembly 22 to face the floor.

Hereafter, the detailed construction of the support assembly 22 in which the second speaker unit 26 is installed will be described. The support assembly 22 includes a support frame 30. The upper end of the support frame 30 is locked to the lower end of the housing 20 by means of screws, etc. The support frame 30 is made of a metallic material, preferably, through a die-casting process.

At the lower end of the support frame 30, a ring part 32 having a ring-shaped configuration is provided. The ring part 32 forms the lower skeleton of the support assembly 22. A pair of supporting parts 34 are provided to extend upwards from the ring part 32. The supporting parts 34 extend upward from the opposite ends of the ring part 32. The upper ends of the supporting parts 34 are connected with each other. In the illustrated embodiment, the supporting parts 34 are formed to have a substantially rectangular plate-shaped configuration so that they can be connected with each other at the upper ends thereof. An opened space is defined between supporting parts 34. An interference prevention portion 36 is defined through the middle portion of each supporting part 34. The interference prevention portion 36 is defined to prevent the supporting part 34 from being interfered with a unit case 50 as will be described below.

A wire groove 38 is defined on a surface of each supporting part 34 such that a wire (not shown) for transmitting an electric signal can be fitted into the wire groove 38. Bosses 40 are formed on the surfaces of the supporting parts 34 which face the floor, to extend toward the floor. The bosses 40 are formed to allow the unit case 50 to be locked to the supporting parts 34 as will be described below.

The ring part 32 is defined with a plurality of holes 42 through which the ring part 32 is locked to a base plate 60 as will be described below. Locking pieces 44 made of synthetic resin are fitted into the holes 42. Each of the locking pieces 44 is formed with an internal thread.

The unit case 50 is formed through injection-molding of synthetic resin. The unit case 50 has a configuration which can be inserted into the support frame 30. That is to say, the unit case 50 has a configuration which conforms to the inner surfaces of the supporting parts 34 of the support frame 30. The portions of the unit case 50 which do not face the supporting parts 34 can be freely formed. The portion of the unit case 50 which faces the floor is opened. As the unit case 50 is facing away from the floor, the cross-section of the unit case 50 is gradually decreased. The unit case 50 can be locked to the support frame 30 by means of screws or can be coupled to the support frame 30 using configurational features.

The opposite portions of the unit case 50 which correspond to the supporting parts 34 are formed to have a length greater than the other portions, thereby forming extended leg portions 52. The distal ends of the extended leg portions 52 can be brought into contact with the base plate 60 as will be described below. The lower ends of the other portions of the unit case 50 which are not formed with the extended leg parts 52 define openings 53. The reference numeral 54 designates a projection which is fitted into each interference prevention portion 36.

A mounting spacer 56 is positioned in the unit case 50, and functions to fill an annular gap between the inner surface of the unit case 50 and the second speaker unit 26. The second speaker unit 26 is mounted along with the mounting spacer 56 to the inner surface of the unit case 50. At this time, the second speaker unit 26 is installed to face the floor through the opened lower end of the unit case 50.

The base plate 60 constitutes the lower surface of the support assembly 22. The base plate 60 is formed to have a substantially disc-shaped configuration. The base plate 60 is locked and fastened to the ring part 32 of the support frame 30. A side wall 61 having a predetermined height is integrally formed at the edge of the base plate 60 to surround the circumferential edge of the ring part 32.

As best shown in FIG. 5, a guide cone 62 is formed at the center portion of the upper surface of the base plate 60 to protrude upward. The guide cone 62 has a frusto-conical configuration. The side wall of the guide cone 62 is inclined toward the circumferential edge of the base plate 60. It is preferred that the side wall of the guide cone 62 is inclined in the shape of a streamline when viewed from the side. The guide cone 62 functions to guide the sound outputted from the second speaker unit 26 toward the openings 53. The reference numeral 64 designates a hole in which a connector for electrically connecting the speaker to the outside is placed.

Cover members 66 are provided to respectively cover the supporting parts 34 of the support frame 30 and constitute a portion of the outer appearance of the support assembly 22.

The cover members 66 only cover the space portions occupied by the supporting parts 34, and the unit case 50 is exposed through the remaining space portions which are not covered by the cover members 66. As a consequence, the outer appearance of the support assembly 22 is constituted by the base plate 60, the cover members 66 and the unit case 50. The interior and the exterior of the support assembly 22 are communicated with each other through the openings 53.

In this embodiment, it is to be readily appreciated that the second speaker unit 26 is installed in the support assembly 22. The speaker units 24 and 28 installed in the housing 20 can be modified in a variety of ways, one typical embodiment of which will be described later.

Hereinbelow, operations of the speaker according to the first embodiment of the present invention constructed as mentioned above will be described in detail.

First, in the present embodiment, the procedure for installing the second speaker unit 26 in the support assembly 22 will be described.

The second speaker unit 26 is mounted along with the mounting spacer 56 in the unit case 50. The unit case 50 having installed therein the second speaker unit 26 is inserted between the supporting parts 34 through the ring part 32 of the support frame 30. At this time, in the illustrated embodiment, the unit case 50 is fastened to the support frame 30 by means of screws. However, it can be contemplated that the unit case 50 can be snap-fitted into the support frame 30 using configurational features.

Next, the base plate 60 is secured to the ring part 32 of the support frame 30, and the cover members 66 are installed to cover the supporting parts 34 of the support frame 30. The cover members 66 can be locked to the support frame 30 and base plate 60 by means of screws or can be snap-fitted into the support frame 30 and base plate 60 using configurational features.

The speaker according to the present invention, which is provided with the support assembly 22 described above, is constructed in such a way as to separately reproduce at least the sound signals which belong to medium and low sound bands. In this case, the first and second speaker units 24 and 26 are used, and the third speaker unit 28 is not used. Also, the third speaker unit 28 can be additionally installed to allow the speaker to separately reproduce sound signals which belong to high, medium and low sound bands.

In the speaker according to this embodiment of the present invention, the second speaker unit 26 is installed in the support assembly 22 to reproduce a sound signal which belongs to a low sound band and to render the reproduced sound. The sound outputted from the second speaker unit 26 is transmitted out of the support assembly 22 through the openings 53 of the unit case 50.

A portion of the sound outputted from the second speaker unit 26 which is installed to face the base plate 60 is guided along the surface of the guide cone 62, and then is discharged to the outside through the openings 53 of the unit case 50, that is, the passages defined between the unit case 50 and the base plate 60.

Accordingly, although the second speaker unit 26 is installed to face the floor, the reproduced sound is discharged not toward the floor but sideward of the speaker.

In the above-described embodiment, the base plate 60 may not be necessarily provided to the support assembly 22, but it is preferred that the guide cone 62 be provided. It can be envisaged that the guide cone 62 is directly mounted to the ring part 32 without using the base plate 60.

Next, the second embodiment of the present invention will be described with reference to FIGS. 6 through 8. The second embodiment of the present invention is directed for a housing in which a plurality of speaker units are installed, and is configured to allow adjustment of the directions of the speaker units installed in the housing. In this embodiment, a support assembly is constructed in the same manner as the first embodiment. Thus, the support assembly installed on the lower end of the housing and the second speaker unit installed in the support assembly are not illustrated in FIGS. 6 through 8.

Figure 6:
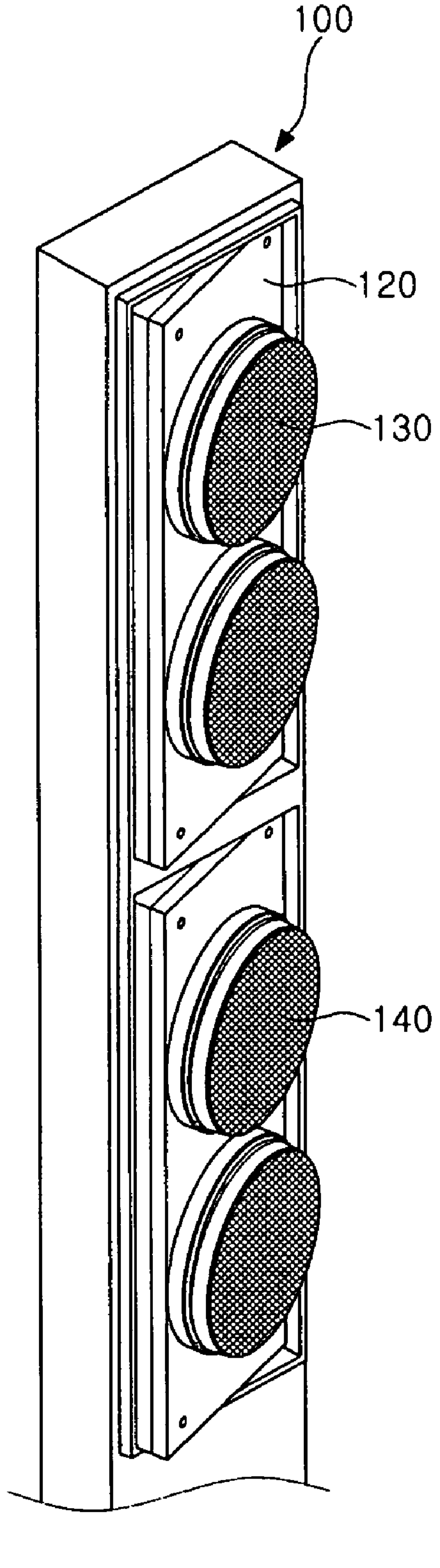
FIG. 6 is an exemplary perspective view illustrating a speaker housing in accordance with a second embodiment of the present invention.
Figure 7:
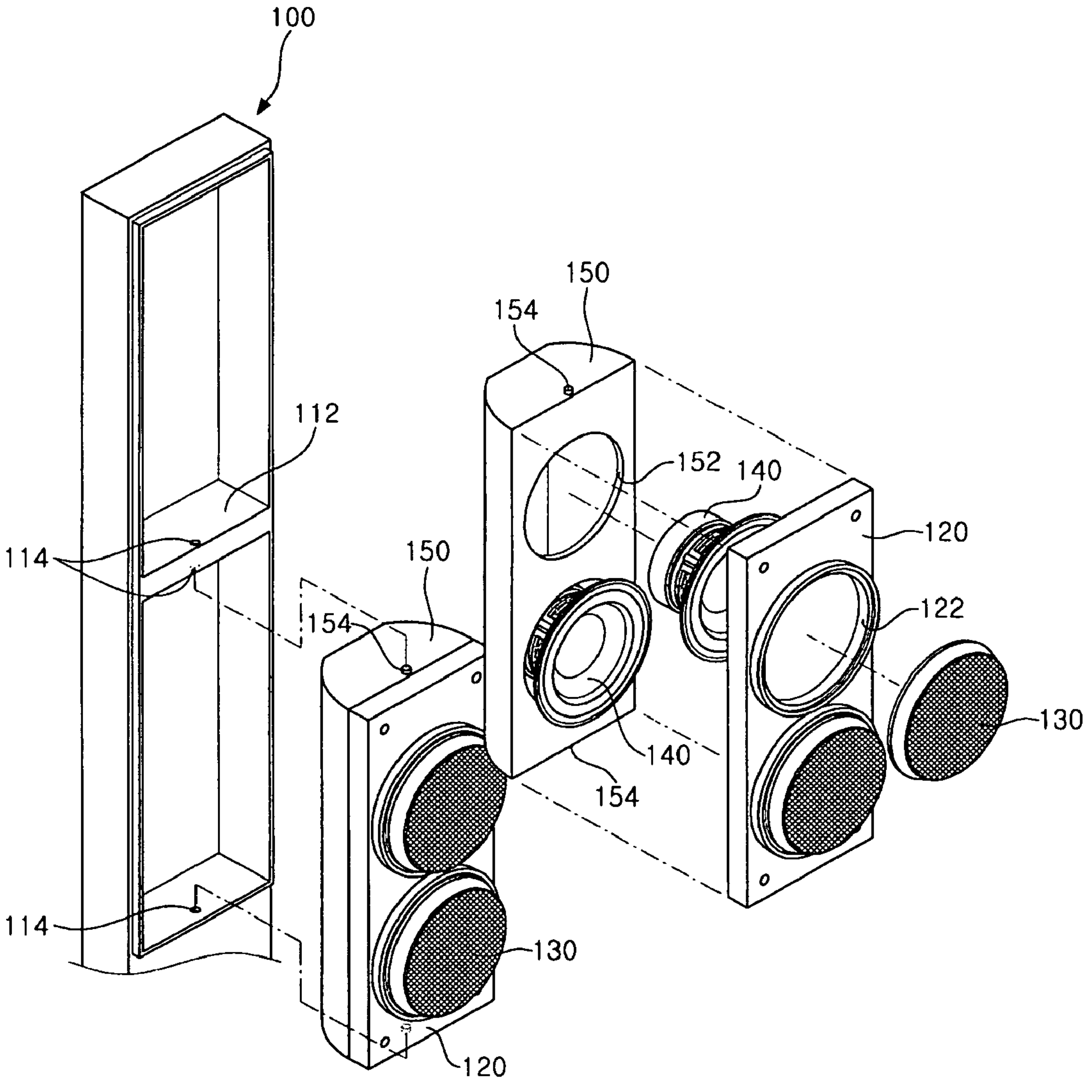
FIG. 7 is an exploded perspective view illustrating the speaker housing according to the second embodiment of the present invention.
Figure 8:
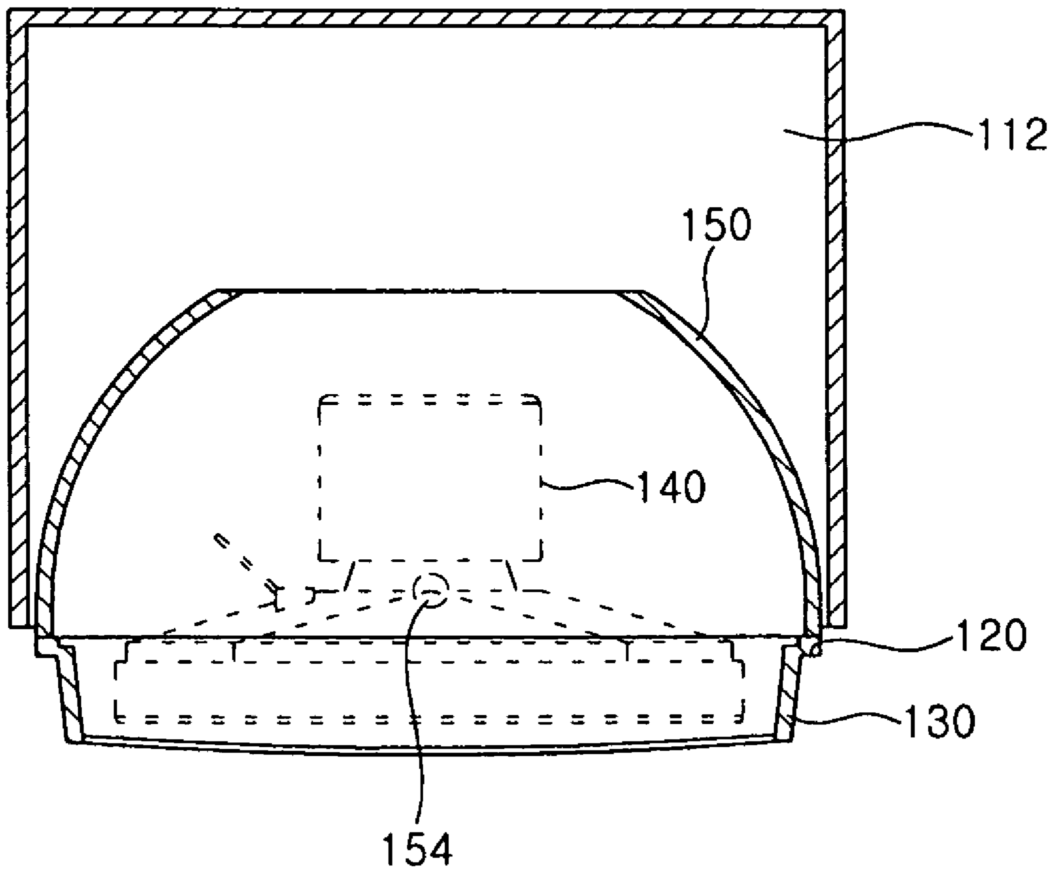
FIG. 8 is a transverse cross-sectional view illustrating the speaker housing according to the second embodiment of the present invention.

FIG. 6 is an exemplary perspective view illustrating a speaker housing in accordance with a second embodiment of the present invention, FIG. 7 is an exploded perspective view illustrating the speaker housing according to the second embodiment of the present invention, and FIG. 8 is a transverse cross-sectional view illustrating the speaker housing according to the second embodiment of the present invention.

Referring to the drawings, the speaker according to this embodiment includes a housing 100 having a plurality of speaker units 140, and a support assembly (not shown) having a separate speaker unit. The housing 100 is formed to have a receptacle-shaped configuration of a predetermined length, such that the plurality speaker units 140 can be installed in the housing 100.

The front end of the housing 100 is opened. The opened front end of the housing 100 is covered by baffles 150, and the speaker units 140 are installed on the baffles 150. The speaker units 140 are installed through installation openings 152 which are defined in the baffles 150. Each baffle 150 is installed such that it can be rotated leftward and rightward about an axis within a predetermined range of angle. Due to the fact that the speaker units 140 are installed to be rotated leftward and rightward by the medium of the baffles 150, a sound transmission direction can be conveniently changed without the need of moving the entire speaker.

In the illustrated embodiment, the baffles 150 are supported such that they can be rotated leftward and rightward about a vertical axis. For example, rotation pins 154 are formed at the widthwise middle positions of front ends on the upper and lower end surfaces of the baffles 50, and pin holes 114 are defined on the upper and lower inner surfaces of the housing 100 at positions corresponding to the rotation pins 154 so that the rotation pins 154 can be rotatably supported in the pin holes 114, respectively. Since the rotation pins 154 are inserted into and rotatably supported in the pin holes 114, the baffles 150 are rotatably supported at the front end of the housing 100.

The baffles 150 are installed in a manner such that they can completely cover the entire front end of the housing 100 which is opened when they are not rotated from the front end of the housing 100. In the illustrated embodiment, a pair of speaker units 140 are installed in each baffle 150.

The baffle 150 can have any configurations so long as the speaker units 140 can be mounted to the baffle 150 and the baffle 150 can be rotated leftward and rightward at the front end of the housing 100. In the illustrated embodiment, when viewed from the top, each of both sides of the baffle 150 is formed in the shape of an arc which has a radius of curvature measured about the rotation pin 154, whereby the baffle 150 has a substantially semi-circular column-shaped configuration. Here, in the case of forming the baffle 150 to have the semi-circular column-shaped configuration, the diameter of the baffle 150 corresponds to one half of the leftward and rightward width of the opened front end of the housing 100. Further, in the case that each of both sides of the baffle 150 is formed in the shape of an arc, the radius of curvature of the arc corresponds to one half of the leftward and rightward width of the front end of the housing 100. In the event that the baffle 150 is formed to have the semi-circular column-shaped configuration or each of both sides of the baffle 150 is formed in the shape of an arc, it is preferred that the rear end of the baffle 150 be opened to communicate the inside of the baffle 150 with the inside of the housing 100.

By forming each of both sides of the baffle 150 in the shape of an arc, when the baffle 150 is rotated leftward and rightward, the baffle 150 is not interfered with both sides of the housing 100, and it is possible to prevent gaps from being created between both sides of the housing 100 and the baffle 150.

In the illustrated embodiment, in order to prevent the speaker units 140 from being directly exposed out of the front end of the housing 100, a front panel 120 is mounted to the front surface of the baffle 150. The front panel 120 has sound passage holes 122 which are defined at positions respectively corresponding to the speaker units 140, and a grille cap 130 is detachably installed in each sound passage hole 122.

In the illustrated embodiment, the housing 100 is divided into two upper and lower compartments by a partitioning wall 112, a pair of baffles 150 are rotatably installed at the front end of the housing 100, and a pair of speakers 140 are installed in each baffle 150. As a result, as can be readily seen from FIG. 6, each baffle 150 can be independently rotated leftward and rightward.

In the present invention, the baffle 150 is installed so that it can be actually rotated leftward and rightward. Unlike the illustrated embodiment, it can be contemplated that one baffle is installed at the front end of the housing 100 and a plurality of speaker units are installed in one baffle. It is also possible that the housing 100 is divided into a plurality of (for example, four) compartments by partitioning walls, a plurality of baffles are installed in the compartments, respectively, and one speaker unit is installed in each baffle. While the baffles 150 are constructed to be arranged up and down in the illustrated embodiment, it is to be readily understood that the present invention is not limited to this arrangement of the baffles 150. Therefore, it can be envisaged that the baffles 150 are constructed to be arranged left and right or side by side in the horizontal or vertical direction. In any case, in this embodiment, it is to be noted that the baffle 150 for supporting the speaker units 140 must be supported to be rotated relative to the housing 100.

Moreover, while the baffle 150 is supported to be rotated leftward and rightward in the illustrated embodiment, the baffle 150 can be constructed to be supported such that it can be rotated upward and downward directions.

In another embodiment, the baffle 150 can be rotatably installed on a partial portion of the housing 100. In this case, a speaker unit can be installed in the baffle 150 which is rotatably supported, and another speaker unit can be fixedly installed on the remaining portion of the housing 100 on which the baffle 150 is not installed.

In this embodiment constructed as mentioned above, as can be readily seen from FIGS. 6 and 7, the directions of the plurality of speaker units 140 can be adjusted as desired. That is to say, in this embodiment, through rotating each baffle 150 about the rotation pins 154 inserted into the pin holes 114, the direction of the speaker units 140 installed in the baffle 150 can be adjusted. Accordingly, without the need of moving the entire housing 100, the direction of the speaker units 140 can be adjusted through manipulating the baffle 150, whereby sound can be transmitted in a desired direction.

In the illustrated embodiment, the baffle 150 having the speaker units is supported to be rotated about a vertical axis. However, as the occasion demands, the baffle 150 can be installed to be rotated about a horizontal axis.

As is apparent from the above descriptions, the speaker according to the present invention provides advantages as described below.

First, in the present invention, at least two speaker units including a second speaker unit capable of reproducing a low sound band are used. Accordingly, since various sound bands can be reproduced using one speaker, the quality of sound outputted from the speaker can be improved. Also, due to the fact that the second speaker unit is installed in a support assembly, it is possible to obtain high sound quality without changing the size of a speaker housing.

Further, in the present invention, the housing has a flat hexahedral configuration, a planar speaker unit is installed in the housing, and a speaker unit for reproducing a low sound band is installed in the support assembly. Therefore, an increased number of speaker units can be installed without increasing the size of the speaker, and the inside space of the speaker can be efficiently utilized.

Moreover, in the present invention, the sound outputted from the speaker unit installed in the support assembly to reproduce low band sound is not directed toward the floor but guided sideward to be discharged to the outside. Hence, the low band sound is not transmitted to the floor not to generate noise, and instead, is reliably transmitted to a user.

Furthermore, in the present invention, the first and third speaker units installed in the housing include planar speaker units. Thus, it is possible to form the housing to have a flat and elongate hexahedral configuration, whereby the entire speaker can be miniaturized.

In addition, in the present invention, it is possible to change the directions of a plurality of speaker units installed in the housing. As a result, a sound transmission direction can be changed through adjusting the angles of the speaker units without moving the housing of the speaker.

Although preferred embodiments of the present invention has been described for illustrative purposes, those skilled in the art will appreciate that various modifications, additions and substitutions are possible, without departing from the scope and spirit of the invention as disclosed in the accompanying claims.

What is claimed is:

1. A speaker comprising:

a housing;

a support assembly installed on a lower end of the housing to support the housing;

at least one first speaker unit installed in the housing to reproduce a sound signal; and a second speaker unit installed in the support assembly to reproduce a sound signal which belongs to a different sound band than the sound signal of the first speaker, wherein the first speaker unit is installed to face a front through a front end of the housing, and the second speaker unit is installed to face a floor on which the support assembly is placed, and wherein the support assembly comprises a guide cone provided to a lower end of the support assembly apart from the second speaker unit and facing the second speaker unit to change a direction of sound outputted from the second speaker unit.

2. The speaker as set forth in claim 1, wherein the first speaker unit is installed in a baffle which is rotatably supported at the front end of the housing which is opened such that the baffle can be rotated to and be fixed at a desired location, the baffle having an axis of rotation behind an outer circumference of the first speaker unit.

3. The speaker as set forth in claim 2, wherein the baffle can be rotated about a horizontal axis and covers the entire front end of the housing which is opened.

4. The speaker as set forth in claim 2, wherein the housing is divided into a plurality of compartments by at least one partitioning wall, and a plurality of baffles are installed in the plurality of compartments.

5. The speaker as set forth in claim 2, wherein the baffle can be rotated about a vertical axis and covers the entire front end of the housing which is opened.

6. The speaker as set forth in claim 5, wherein a front panel is installed on a front surface of the baffle and has a grille cap at a position which faces the first speaker unit.

7. The speaker as set forth in claim 5, wherein the baffle has a semi-circular column-shaped configuration which has a flat front surface.

8. The speaker as set forth in claim 5, wherein each of both sides of the baffle is formed in the shape of an arc which has a radius of curvature corresponding to a half of the leftward and rightward width of the housing.

9. The speaker as set forth in claim 8, wherein rotation pins are formed at widthwise middles of front ends on upper and lower end surfaces of the baffle, and pin holes are defined on upper and lower inner surfaces of the housing at positions corresponding to the rotation pins so that the rotation pins can be rotatably supported in the pin holes, respectively.

10. The speaker as set forth in claims 7 or 8, wherein a rear end of the baffle is opened to communicate the inside of the baffle with the inside of the housing.

11. The speaker as set forth in claim 1, wherein the support assembly further comprises:

a support frame coupled to the housing, and having a ring-shaped ring part and supporting parts which extend from opposite ends of the ring part to be connected with each other at distal ends thereof; and a unit case installed between the supporting parts of the support frame, having installed therein the second speaker unit, and defined with openings for communicating the exterior and interior of the support assembly with each other, wherein the guide cone is installed on lower ends of the supporting parts to face the second speaker unit to guide sound outputted from the second speaker unit.

12. The speaker as set forth in claim 11, wherein a base plate is secured to the ring part of the support frame to constitute a lower surface of the support assembly.

13. The speaker as set forth in claim 12, wherein the guide cone is integrally formed with the base plate and has a frusto-conical configuration.

14. The speaker as set forth in claim 13, wherein the first speaker unit has a planar configuration and reproduces a medium frequency sound signal which belongs to a medium sound band.

15. The speaker as set forth in claim 14, wherein a plurality of first speaker units are installed on a middle portion of the housing to be arranged in a vertical direction.

16. The speaker as set forth in claim 1, further comprising:

a third speaker unit installed on an upper end of the housing to reproduce a high frequency sound signal which belongs to a high sound band.

17. The speaker as set forth in claim 16, wherein the housing has a hexahedral configuration in which a leftward and rightward width is greater than a forward and rearward width and which is flat and elongate in the vertical direction.

18. A speaker comprising:

a housing;

a support assembly installed on a lower end of the housing to support the housing;

at least one first speaker unit installed in the housing to reproduce a sound signal; and a second speaker unit installed in the support assembly to reproduce a relatively low frequency sound signal which belongs to a relatively low sound band, wherein openings are defined through both sides of the support assembly to transmit to the outside sound reproduced by the second speaker unit, and a guide cone is provided to a lower end of the support assembly apart from the second speaker unit to change a direction of the reproduced sound of the second speaker unit toward the openings.

19. The speaker as set forth in claim 18, wherein the support assembly comprises:

a support frame formed through die-casting, coupled to the housing, and having a ring-shaped ring part and supporting parts which extend from opposite ends of the ring part to be connected with each other at distal ends thereof;

a unit case installed between the supporting parts of the support frame, having installed therein the second speaker unit, and defined with the openings for communicating the exterior and interior of the support assembly with each other; and a base plate constituting a lower surface of the support assembly and having the guide cone for guiding sound outputted from the second speaker unit.

20. The speaker as set forth in claims 18, wherein each first speaker unit has a planar configuration and reproduces a medium frequency sound signal which belongs to a medium sound band, and a plurality of first speaker units are installed on a middle portion of the housing to be arranged in a vertical direction.

21. The speaker as set forth in claim 20, further comprising:

a third speaker unit installed on an upper end of the housing to reproduce a high frequency sound signal which belongs to a high sound band.

22. A speaker comprising:

a housing;

a support assembly installed on a lower end of the housing to support the housing;

a first speaker unit installed in the housing to reproduce a sound signal; and a second speaker unit installed in the support assembly to reproduce a sound signal which belongs to a different sound band than the sound signal of the first speaker, wherein the support assembly comprises:

a support frame coupled to the housing;

a unit case having installed therein the second speaker unit, and being defined with openings for communicating an exterior and an interior of the support assembly with each other;

a base plate being secured to the support frame and/or the unit case to constitute a lower surface of the support assembly; and a ring-shaped ring part and supporting parts which extend from opposite ends of the ring part to be connected with each other at distal ends thereof.

23. The speaker as set forth in claim 22, wherein the base plate further comprises:

a guide cone formed on the base plate to face the second speaker unit to guide sound outputted from the second speaker unit.

24. The speaker as set forth in claim 23, wherein the guide cone is integrally formed with the base plate and has a frusto-conical configuration.

* * * * *